United States Patent
Ott et al.

(10) Patent No.: US 11,391,339 B2
(45) Date of Patent: Jul. 19, 2022

(54) LEAD-LAG DAMPER

(71) Applicant: ITT Manufacturing Enterprises LLC, Wilmington, DE (US)

(72) Inventors: Mark J. Ott, Orchard Park, NY (US); Robert Misevski, Orchard Park, NY (US); Timothy J. Boerschig, Amherst, NY (US)

(73) Assignee: ITT Manufacturing Enterprises LLC, Wilmington, DE (US)

( * ) Notice: Subject to any disclaimer, the term of this patent is extended or adjusted under 35 U.S.C. 154(b) by 0 days.

(21) Appl. No.: 17/425,777

(22) PCT Filed: Jan. 29, 2020

(86) PCT No.: PCT/US2020/015613
§ 371 (c)(1),
(2) Date: Jul. 26, 2021

(87) PCT Pub. No.: WO2020/160105
PCT Pub. Date: Aug. 6, 2020

(65) Prior Publication Data
US 2022/0042569 A1    Feb. 10, 2022

Related U.S. Application Data

(60) Provisional application No. 62/825,532, filed on Mar. 28, 2019, provisional application No. 62/798,161, filed on Jan. 29, 2019.

(51) Int. Cl.
*F16F 13/10*  (2006.01)
*B64C 27/51*  (2006.01)
*F16F 13/14*  (2006.01)

(52) U.S. Cl.
CPC ............ *F16F 13/105* (2013.01); *B64C 27/51* (2013.01)

(58) Field of Classification Search
CPC .......... F16F 13/105; F16F 13/06; F16F 13/08; F16F 13/14; F16F 13/16; F16F 13/24; F16F 13/1436; B64C 27/51
USPC ....................................... 267/140.11, 140.12
See application file for complete search history.

(56) References Cited

U.S. PATENT DOCUMENTS

| | | |
|---|---|---|
| 2,774,553 A | 12/1956 | Jensen |
| 3,782,854 A | 1/1974 | Rybicki |
| 4,676,720 A * | 6/1987 | Niwa ...................... B64C 27/51 |
| | | 416/134 A |

(Continued)

OTHER PUBLICATIONS

International Search Report and Written Opinion for International Application No. PCT/US20/15613 dated Apr. 20, 2020, pp. 13.

*Primary Examiner* — Robert A. Siconolfi
*Assistant Examiner* — James K Hsiao
(74) *Attorney, Agent, or Firm* — Mannava & Kang, P.C.

(57) ABSTRACT

Technologies are generally described for lead-lag dampers. An example lead-lag may include a single- or two-stage floating annular ring, elastomer bearings, a tension stop, a compression stop, and a plunger/spring volume compensator. The floating annular ring(s) form orifice(s) in conjunction with the remaining damper components may provide stable performance by tracking with any center shaft misalignment during operation. The lead-lag damper may also include a secondary spring system allowing or disallowing fluid flow between chambers based on slow or sudden movement of the shaft.

19 Claims, 13 Drawing Sheets

(56) References Cited

U.S. PATENT DOCUMENTS

| | | | |
|---|---|---|---|
| 5,501,434 A | 3/1996 | McGuire | |
| 8,752,784 B2* | 6/2014 | Jolly | B64C 27/51 |
| | | | 416/106 |
| 8,985,950 B2 | 3/2015 | Lopez et al. | |
| 9,273,751 B2* | 3/2016 | Setty | F16F 13/305 |
| 2008/0018031 A1* | 1/2008 | Goudie | F16F 3/087 |
| | | | 267/140.11 |
| 2009/0166939 A1* | 7/2009 | Goudie | F16F 13/105 |
| | | | 267/140.11 |
| 2015/0069683 A1* | 3/2015 | Hochberg | F03G 7/08 |
| | | | 267/140.11 |
| 2017/0043868 A1 | 2/2017 | Sequera et al. | |
| 2018/0128341 A1 | 5/2018 | Mizuno | |
| 2018/0162519 A1* | 6/2018 | Parham, Jr. | B64C 27/51 |
| 2019/0002085 A1* | 1/2019 | Choi | F16F 15/121 |
| 2019/0322363 A1* | 10/2019 | Haldeman | B64C 27/35 |

\* cited by examiner

LEAD-LAG DAMPER

CROSS-REFERENCE TO RELATED APPLICATIONS

The present application is a U.S. National Stage filing under 35 U.S.C. § 371 of International Application PCT/US20/15613, filed Jan. 29, 2020, which claims priority to U.S. Patent Applications Ser. No. 62/798,161 filed on Jan. 29, 2019, entitled "LEAD-LAG DAMPER, FLUID-ELASTIC VIBRATION MOUNT, AND MONITORING SYSTEM" and Ser. No. 62/825,532 filed on Mar. 28, 2019, entitled "LEAD-LAG DAMPER".

BACKGROUND

Unless otherwise indicated herein, the materials described in this section are not prior art to the claims in this application and are not admitted as prior art by inclusion in this section.

Shock absorbers or dampers are mechanical or hydraulic devices that absorb and damp shock impulses. They convert kinetic energy from the shock into another forms of energy (e.g., heat) to be dissipated. Shock absorbers or dampers may be of different types such as gas-charged, mono- or twin-tube, positive sensitive damping, acceleration sensitive damping, springover, and so on. Shock absorbers or dampers are used in automotive, aerospace, and similar industries. Depending on application, these devices may be subjected to varying and repeated forces. Thus, shock absorbers or dampers may be subject to failure at unexpected times.

SUMMARY

The present disclosure generally describes a lead-lag damper with one or two annular rings that operate as floating orifices and/or a secondary spring mechanism for enhanced performance.

According to some examples, a lead-lag damper may include an outer tube mechanically coupled to a first coupler; one or more substantially annular elastomer bearings inside the outer tube; a spacer tube concentrically and movably positioned inside the outer tube and partially surrounded by the one or more elastomeric bearings; an inner tube mechanically coupled to a second coupler and concentrically positioned inside the spacer tube, where sidewalls of the inner tube define a first fluid chamber inside the inner tube; and a floating annular ring positioned in concentric alignment about a portion of the outer tube. The one or more elastomer bearings and the floating annular ring may define at least a second fluid chamber and a third fluid chamber inside the outer tube, the second and third fluid chambers may be configured in fluidic communication with one another and with the first fluid chamber, and the floating annular ring may be configured to substantially surround the spacer tube, track radially with a spacer tube misalignment, and control the fluidic communication between the second fluid chamber and the third fluid chamber.

According to other examples, the floating annular ring may include an inside surface with two or more protrusions, the two or more protrusions may each extend at least partially across a width of the inside surface of the floating annular ring, and the two or more protrusions may be configured to occasionally reposition the floating annular ring to maintain a coaxial relationship to the spacer tube. The floating annular ring may be made from one or more of a polymeric material, rubber, vulcanized rubber, a ceramic material, a metal, or a metal alloy. The lead-lag damper may further include a guide structure inside the outer tube, the guide structure configured to limit movement of the floating annular ring to a predefined axial position and allow the floating annular ring to translate radially along with the spacer tube in operation.

According to further examples, the guide structure may be configured to allow the floating annular ring to move radially within a limited range effective to control a consistent fluid exchange gap between the second fluid chamber and the third fluid chamber of the outer tube. The guide structure may be configured to move within a limited range inside the outer tube or is mechanically coupled to one of the spacer tube and the outer tube. The lead-lag damper may also include a plunger-spring system inside the inner tube to provide volume compensation fluid exchange between one or both of the second and third fluid chambers and the first fluid chamber. The lead-lag damper may further include one or more seeping holes in a sidewall of the inner tube, the seeping holes configured to provide fluidic communication between the first fluid chamber and one or both of the second and third fluid chambers without causing a dynamic pressure change in the first fluid chamber.

According to other examples, a lead-lag damper may include an outer tube mechanically coupled to a first coupler; one or more substantially annular elastomer bearings inside the outer tube; a spacer tube concentrically and movably positioned inside the outer tube and partially surrounded by the one or more elastomeric bearings; an inner tube mechanically coupled to a second coupler and concentrically positioned inside the spacer tube, where sidewalls of the inner tube define a first fluid chamber inside the inner tube; a first floating annular ring positioned in concentric alignment about a first portion of the outer tube; and a second floating annular ring positioned in concentric alignment about a second portion of the outer tube offset from the first portion. The one or more elastomer bearings, the first floating annular ring, and the second floating annular ring at least partially may define one or more of a second fluid chamber, a third fluid chamber, and a fourth fluid chamber inside the outer tube; the second, third, and fourth fluid chambers may be configured in fluidic communication with one another and with the first fluid chamber; and the first floating annular ring and the second floating annular ring may be configured to substantially surround the spacer tube, and control a consistent fluid exchange gap, respectively, between the second and third fluid chambers and the third and fourth fluid chambers of the outer tube.

According to some examples, at least one of the first floating annular ring and the second floating annular ring may include an inside surface with two or more protrusions, the two or more protrusions may each extend at least partially across a width of the inside surface, the two or more protrusions may be substantially equidistantly distributed along the inside surface, and the two or more protrusions may be configured to occasionally reposition the first floating annular ring or the second floating annular ring to maintain a coaxial relationship to the spacer tube.

According to other examples, the first floating annular ring and the second floating annular ring may be made from a material that is dissimilar to a material of the spacer tube to prevent galvanic corrosion or galling in operation. The lead-lag damper may also include a first guide structure and a second guide structure inside the outer tube, the first guide structure and the second guide structure configured to limit movement of the first floating annular ring and the second floating annular ring, respectively, to a predefined axial position and allow the first floating annular ring and the second floating annular ring to move or rotate radially along with the spacer tube in operation. The lead-lag damper may further include a plunger-spring system inside the inner tube to provide volume compensation fluid exchange between the first fluid chamber and one or more of the second, third, and fourth fluid chambers.

According to further examples, a lead-lag damper may include an outer tube mechanically coupled to a first coupler; one or more substantially annular elastomer bearings inside the outer tube; a spacer tube concentrically and movably positioned inside the outer tube and partially surrounded by the one or more elastomeric bearings; an inner tube mechanically coupled to a second coupler and concentrically positioned inside the spacer tube, where sidewalls of the inner tube define a first fluid chamber inside the inner tube; a first floating annular ring positioned in concentric alignment about a first location inside the outer tube, where the first floating annular ring is configured to substantially surround the spacer tube; a first guide structure about the first location inside the outer tube, the first guide structure configured to limit movement of the first floating annular ring to a predefined axial position and allow the first floating annular ring to move and rotate radially along with the spacer tube; a second floating annular ring positioned in concentric alignment about a second location inside the outer tube offset from the first location; and a second guide structure about the second location inside the outer tube, the second guide structure configured to substantially surround the spacer tube, limit movement of the second floating annular ring to a predefined axial position, and allow the second floating annular ring to move and rotate radially.

According to some examples, the one or more elastomer bearings, the first guide structure, and the first floating annular ring may define at least partially a second fluid chamber and a third fluid chamber, and the first floating annular ring may be configured to control a consistent fluid exchange between the second and third fluid chambers through a fluid exchange gap between an inside surface of the first annular ring and an outside surface of the spacer tube. The lead-lag damper may also include a raised or recessed annular tab on an outside surface of the spacer tube, the raised or recessed annular tab configured to enter a fluid exchange gap defined by the first floating annular ring in a tension state or a compression state; and further control the fluid exchange between the second fluid chamber and the third fluid chamber through the fluid exchange gap. The one or more elastomer bearings, the second guide structure, and the second floating annular ring may define at least partially the third fluid chamber and a fourth fluid chamber, and the second floating annular ring may be configured to control a consistent fluid exchange between the third and fourth fluid chambers through a fluid exchange gap between an outside surface of the second annular ring and an inside surface of the outer tube.

According to other examples, a method to manufacture a lead-lag damper may include mechanically coupling an outer tube to a first coupler; fitting one or more substantially annular elastomer bearings inside the outer tube; fitting a spacer tube concentrically and movably inside the outer tube, where the spacer tube is partially surrounded by the one or more elastomeric bearings; mechanically coupling an inner tube to a second coupler, where sidewalls of the inner tube define a first fluid chamber inside the inner tube; fitting a plunger-spring system inside the inner tube to provide volume compensation fluid exchange between the first fluid chamber and two or more fluid chambers of the outer tube; forming one or more seeping holes in the sidewalls of the inner tube and the spacer tube to facilitate fluidic exchange between the first chamber and the two or more fluid chambers of the outer tube; fitting a floating annular ring in concentric alignment about a portion of the outer tube such that the floating annular ring substantially surrounds the spacer tube and is radially movable to control a consistent fluid exchange between the one or more fluid chambers of the outer tube; and partially fitting the inner tube inside the spacer tube.

According to further examples, the method may also include forming a guide structure inside the outer tube to limit movement of the floating annular ring to a predefined axial position and to allow the floating annular ring to move radially within a limited range effective to control a consistent fluid exchange gap between the one or more fluid chambers of the outer tube. The method may further include forming the floating annular ring by disposing two or more protrusions on an inside surface of the floating annular ring such that the two or more protrusions occasionally reposition the annular ring to maintain a coaxial relationship to the spacer tube.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
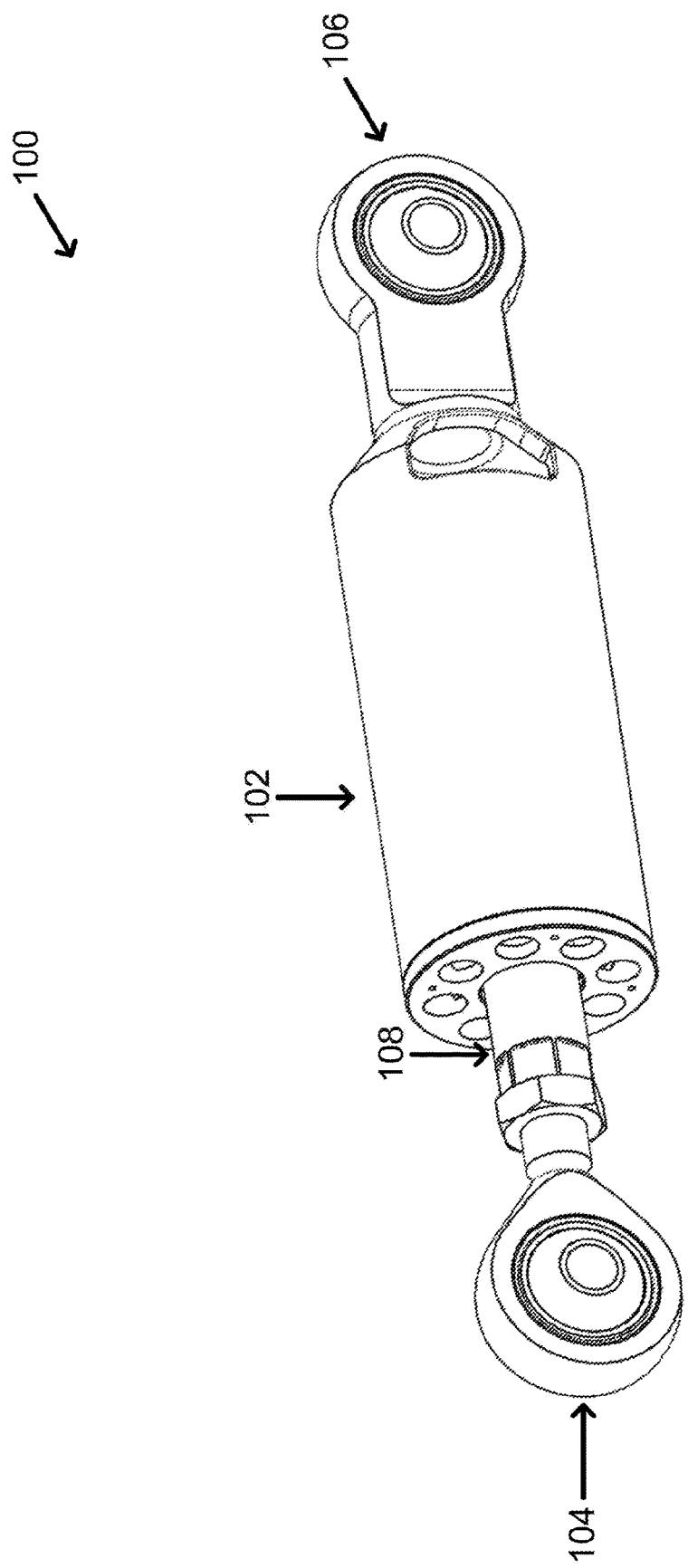
FIG. 1 illustrates an isometric exterior view of an example lead-lag damper.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems and/or devices associated with a lead-lag damper with at least one annular ring that operates as a floating orifice and/or a secondary spring mechanism for enhanced performance.

Briefly stated, technologies are generally described for lead-lag dampers. An example lead-lag may include a single- or two-stage floating annular ring, elastomer bearings, a tension stop, a compression stop, and a plunger/spring volume compensator. The floating annular ring(s) in conjunction with the remaining damper components may facilitate stabilized performance by tracking a center shaft misalignment during operation. The lead-lag damper may also include a secondary spring system that selectively admits or blocks fluid flow between chambers based on a rate of movement of the shaft.

FIG. 1 illustrates an isometric exterior view of an example lead-lag damper, arranged in accordance with at least some embodiments described herein.

The lead-lag damper 100 in FIG. 1 includes a body comprising a pair of concentric substantially cylindrical (inner and outer) tubes 108, 102, and couplers 104 and 106. A piston-rod assembly may extend through the inner tube 108. In a helicopter, rotor blades are coupled to a rotor hub through their root portions with the tip portion being on the opposite end of each blade. A lead-lag damper according to examples, may facilitate the coupling between a rotor hub and a rotor blade by having the coupler 106 couple to the rotor hub and coupler 104 couple to a rotor root. In operation, dampened extension and compression of the concentrically arranged outer tube 102 and inner tube 108 may provide stabilizing effects to the rotor.

Lead-lag dampers are commonly used in helicopter rotors and similar systems. In a helicopter, the blade on an advancing side of the rotor may experience an airflow equal to the blade's speed and a forward speed of the helicopter. The blade on the retreating side of the rotor may experience airflow equal to the speed of the blade minus the forward speed of the helicopter. The difference in speeds of the two rotor sides may cause a dissymmetry of lift. To counter dissymmetry, the blades may flap up and down around the flapping hinges. The blade on the advancing side may flap up, reducing the angle of attack and generating lift. The blade on the retreating side may flap down, increasing the angle of attack and increasing lift. Due to conservation of momentum, the blade flapping up may speed up as the blades' center of gravity moves inwards toward the rotor hub. Because the rotor is rotating at a constant speed, the blade flapping up needs to move forward around the lead-lag hinge. In a similar way, the blade flapping down may slow down, thus lags. The blades may, thus, hunt forward and backwards from the neutral position following a sinusoidal pattern as the rotor rotates. Lead-lag dampers may reduce the force of the hunting, prevent excess back and forth movement around a drag hinge, and compensate for acceleration and deceleration caused by the Coriolis effect behind the above-discussed helicopter processes. In a lead-lag damper according to examples, one or two stages of floating annular rings may provide stable performance by tracking any center shaft misalignment during operation. In other examples, a secondary spring system may allow or disallow fluid flow between chambers based on slow or sudden movement of the piston-rod assembly (shaft).

Figure 2:
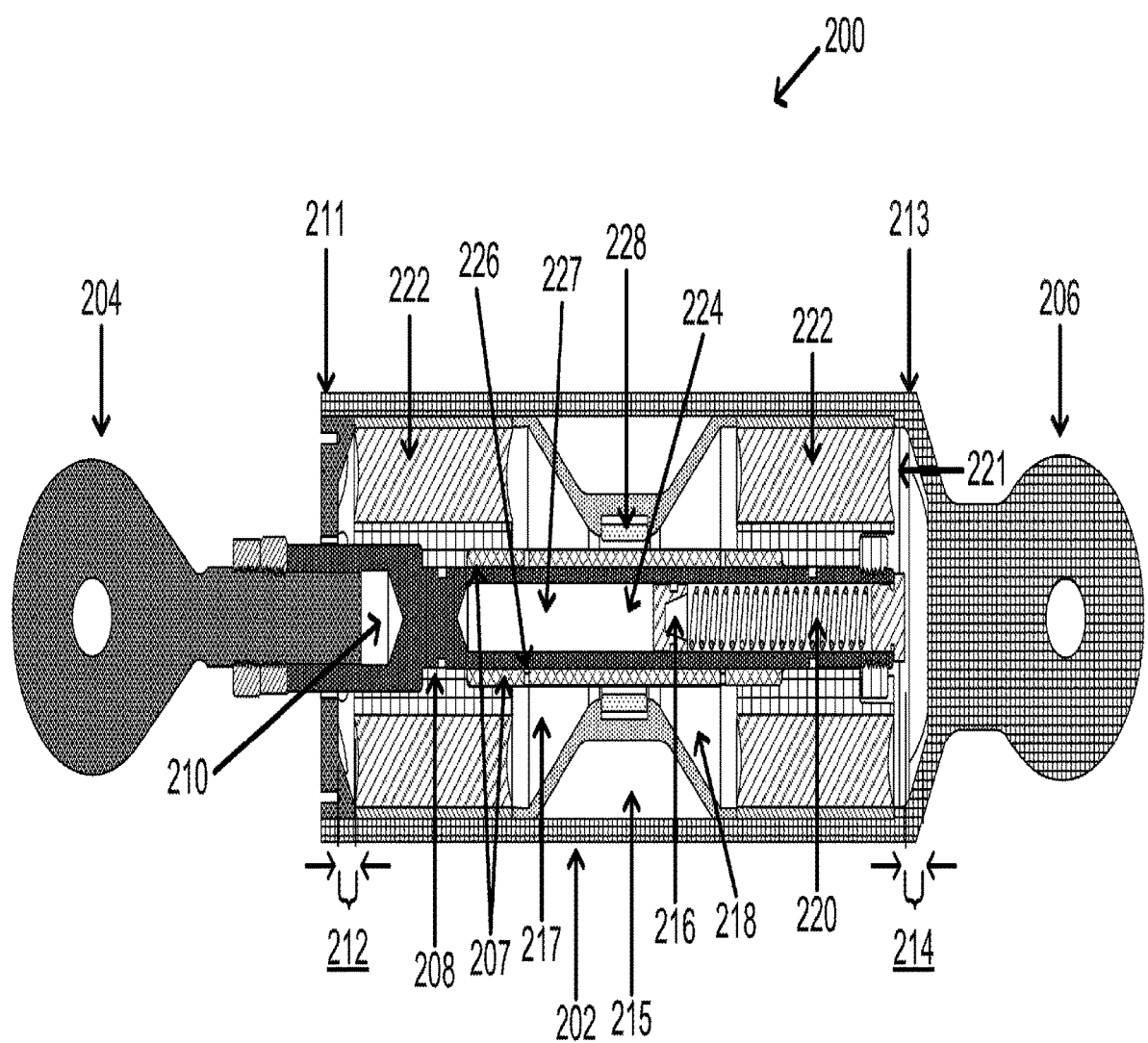
FIG. 2 illustrates a side cross-sectional view of an example single-stage floating annular ring lead-lag damper.

FIG. 2 illustrates a side cross-sectional view of an example single-stage floating annular ring lead-lag damper, arranged in accordance with at least some embodiments described herein.

The lead-lag damper shown in diagram 200 includes couplers 204, 206, an outer tube 202, an inner tube 208, a spacer tube 207 with seeping holes 226, and a floating annular ring 228. A portion of coupler 204 may extend into the inner tube 208 with an air gap 210 at its tip. The inner tube 208 may include a fluid chamber 224. A plunger 216 and a spring 220 can be housed in the inner tube 208 along with fluid chamber 224. The inner tube 208 may further include seeping holes 227. The outer tube 202 may include one or more fluid chambers 217, 218. The outer tube 202 may also house one or more elastomer bearings 222 in an annular gap 221 between the outer tube 202 and the inner tube 208. The floating annular ring 228 may be positioned about a center portion of both tubes and held in place between the fluid chambers 217, 218 of the outer tube 202. The lead-lag damper may also include a tension stop 212 located at a tension end 211 and a compression stop 214 located at a compression end 213. The inner tube 208, the spacer tube 207, the plunger 216, and the spring 220 may be collectively referred to as inner tube assembly.

When installed in a helicopter, the outer tube 202 may be attached to the rotor hub via coupler 206, and the inner tube 208 may be coupled to a blade root via coupler 204. Coupler 204 may be coupled to the inner tube 208 through a set of threads and adjusted through the threads with its tip moving into and out of the air gap 210. Elastomer bearings 222 may be in the annular gap 221 occurring between the two tubes, thereby forming an elastomeric layer. The plunger and spring system (sometimes referred to as piston-rod assembly) comprising plunger 216 and spring 220 may extend axially inside the inner tube 208 along with the fluid chamber 224. Thus, the position of the fluid chamber 224 may be substantially fixed relative to the inner tube 208, and the plunger and spring system may be substantially fixed relative to the outer tube 202. Spring 220 may be in contact on the plunger 216.

In operation, two fluid flows may occur. A first fluid flow may be facilitated between fluid chambers 217 and 218 defined partially by the elastomer bearings 222. The first fluid flow may occur through a gap between the floating annular ring 228 and an outside surface of the spacer tube 207 as the inner tube moves during operation. As coupler 204 moves in or out, the spacer tube 207 may also move in or out, by flexing the elastomeric bearings. A second fluid flow may occur between the fluid chambers 217, 218 of the outer tube 202 and fluid chamber 224 of the inner tube 208. Seeping holes 226 and 217 may facilitate the second fluid flow in response to volume changes in the fluid caused by temperature change. Small size of the seeping holes 226, 227 (and position misalignment of the holes of the spacer tube 207 and inner tube 208) may restrict the flow and thereby prevent dynamic pressure change inside the inner tube 208.

The floating annular ring 228 may rotate along with the inner tube 208 and contact an outside surface of the spacer tube 207 occasionally to enable the floating annular ring 228 to track any inner tube assembly (shaft) radial movement, thereby keeping substantially the same orifice area and stable performance. In operation, the lead-lag motion of the rotor blade may induce a relative elongated linear separation (or compression) between the inner tube 208 and the outer tube 202, which in turn may lead to a deformation of the elastomer bearings 222 (e.g., a shear force leading to deformation). The lead-lag motion may also induce a relative volume change of fluid chambers 217 and 218 such that field-dependent damping force is added to the output force of the damper.

Flexible elastomer bearing assemblies provide support and center alignment of the inner tube assembly to the outer tube assembly. While the flexible bearings may be designed to allow axial movement with minimal radial movement, some radial movement of the inner tube assembly relative to the outer tube may be possible. Additionally, manufacturing processes and tolerances may not allow perfect concentric alignment of the inner tube assembly to the outer tube assembly. The floating annular ring(s) may maintain co-axial alignment of the floating annular ring itself with the inner tube while reducing potential side-loading and consequent wear.

Figure 3:
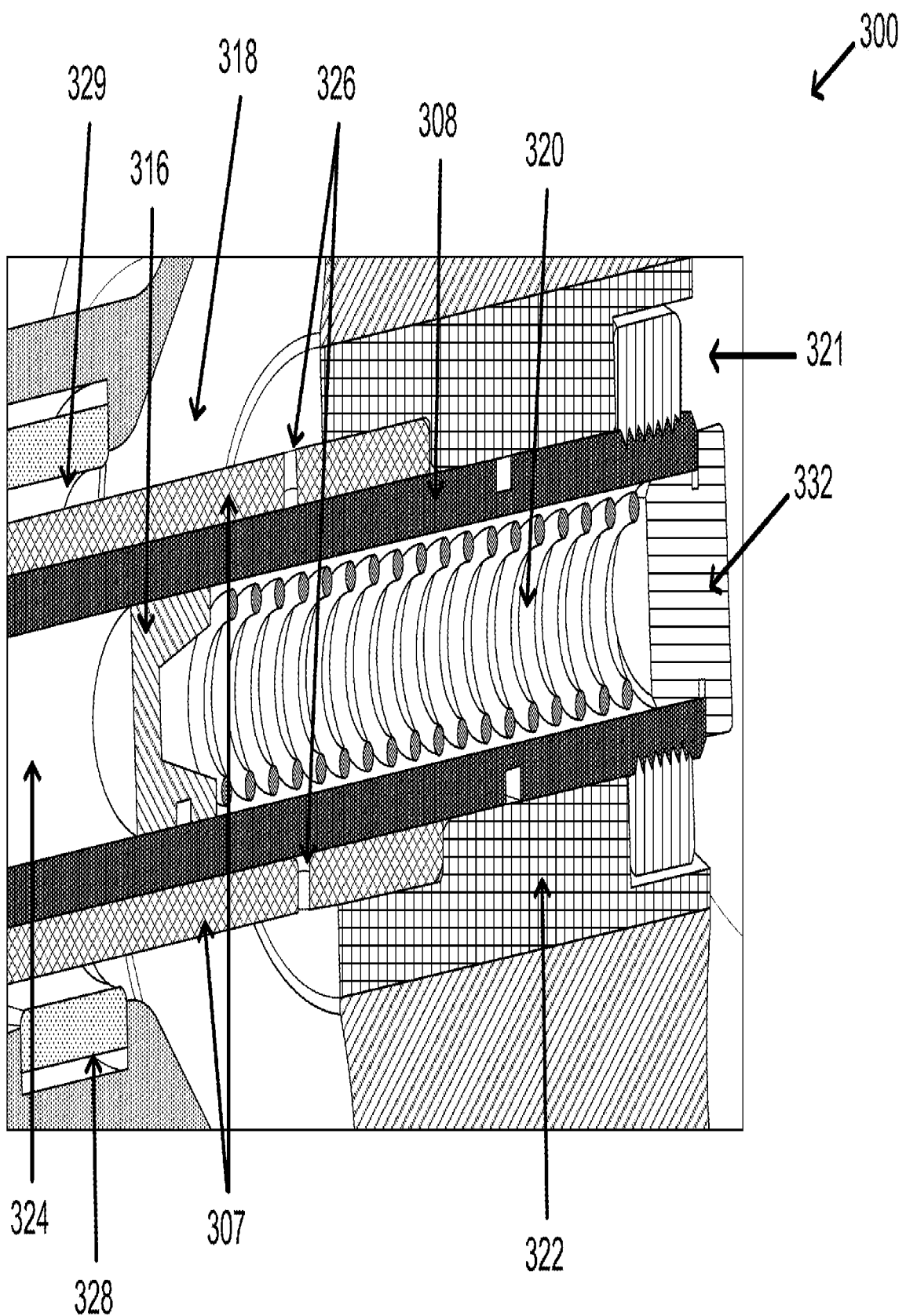
FIG. 3 illustrates an exploded side cross-sectional view of the example lead-lag damper of FIG. 2.

FIG. 3 illustrates an exploded side cross-sectional view of the example lead-lag damper of FIG. 2, arranged in accordance with at least some embodiments described herein.

Diagram 300 shows a spring 320, a plunger 316, and fluid chamber 324 inside an inner tube 308, a portion of floating annular ring 328, a fluid exchange gap 329, an annular gap 321 around the inner tube 308, a spacer tube 307 around the inner tube 308, an elastomer bearing 322, an inner tube cap 332, a fluid chamber 318 around the inner tube 308, and seeping holes 326 in the spacer tube 307. Similar to the example of FIG. 2, the inner tube 308 is located concentrically inside an outer tube (not shown) and includes a plunger-spring system, a portion of which, the spring 320 and the plunger 316 are shown in the diagram. The elastomer bearing 322 may be one or multiple elastomer bearings and is located in the annular gap 321 occurring between the outer tube and the spacer tube 307.

For the example of FIG. 3, a portion of inner tube 308 is surrounded by the elastomer bearing 322. A cut portion of the floating annular ring 328 is shown around at least another (substantially central) portion of the spacer tube 307. Thus, the floating annular ring 328 forms a floating orifice to surround a portion of the spacer tube 307 with the fluid exchange gap 329 in-between. The fluid exchange gap 329 may facilitate fluid exchange between fluid chamber 318 and another fluid chamber (not shown) on opposite side of the floating annular ring 328. Seeping holes 326 are configured to facilitate fluid exchange between the fluid chamber 324 inside the inner tube 308 (when the spring 320 is compressed and the fluid chamber 324 extends past the seeping holes 326) and a fluid chamber 318 inside the outer tube. The fluid flow facilitated by the seeping holes 326 is a volume compensation flow that occurs when fluid volume changes in response to internal temperature changes. Inner tube cap 332 provides a boundary for the inner tube 308 and support for the spring 320.

A fluid volume compensation flow may avoid challenges of pressurized gas-based systems. Specifically, the presently described systems may alleviate leakage of pressurized gas over time, which may require maintenance systems inspections and re-pressurizations to compensate for the gas loss. The described plunger-spring system of the lead-lag damper may provide several hundred pounds of pressure in some example implementations. In some examples (as shown in diagram 300), a portion of the plunger 316 (plunger head) may be hollowed out reducing a mass of the plunger. Centrifugal forces on the plunger-spring system of the lead-lag damper may be reduced due to the reduced mass of the plunger head. Reduced centrifugal forces may, in turn, result in decreased wear and tear.

Figure 4A:
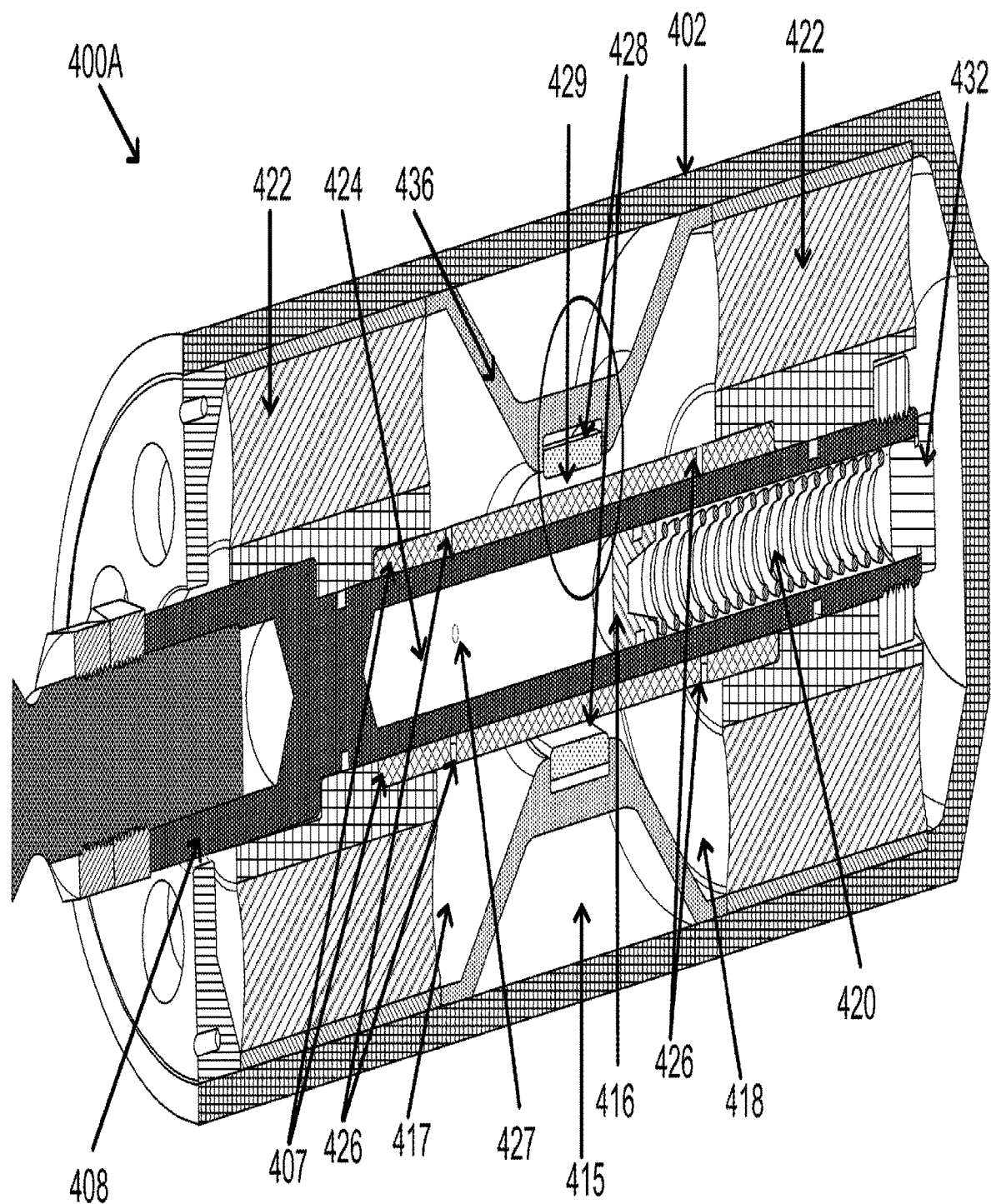
FIG. 4A illustrates a cross-sectional perspective view of a portion of a single-stage floating annular ring lead-lag damper.

FIG. 4A illustrates a cross-sectional perspective view of a portion of a single-stage floating annular ring lead-lag damper, arranged in accordance with at least some embodiments described herein.

Diagram 400A shows an outer tube 402 of a lead-lag damper with an inner tube 408, spacer tube 407 around the inner tube 408, seeping holes 426 and 427, fluid chamber 424, a plunger 416, a spring 420, and an inner tube cap 432. The lead-lag damper further includes elastomer bearings 422, fluid chambers 417, 418, air gap 415, guide structure 436, floating annular ring 428, and fluid exchange gap 429.

As in previous examples, the inner tube 408 is concentrically positioned inside the outer tube 402 surrounded by the spacer tube 407 with an annular gap between the inner and outer tubes. The elastomer bearings 422 are positioned in the annular gap and surround the inner tube 408 radially. The inner tube cap 432, the plunger 416, and the spring 420, which are part of a plunger-spring system, are positioned axially inside the inner tube 408 along with the fluid chamber 424. Seeping holes 426 in the spacer tube 407 and seeping hole 427 in the inner tube facilitate volume compensation fluid exchange between the fluid chamber 424 inside the inner tube 408 and fluid chambers 417, 418 in the annular gap of the outer tube 402. Floating annular ring 428 is positioned between the guide structure 436 and the spacer tube 407 annularly surrounding a substantially central portion of the spacer tube 407 with the fluid exchange gap 429 between the floating annular ring 428 and the spacer tube 407 to facilitate fluid exchange between fluid chambers 417 and 418.

As shown in diagram 400A, the elastomer bearings 422 act as dynamic seals within the annular gap and define fluid chambers 417, 418. The elastomer bearings 422 also stabilize the inner tube 408 inside the outer tube 402. A relative linear motion between the plunger-spring system and the inner tube 408 induced by the lead-lag motion of the damper when in operation may create a field-dependent damping force for the rotor blades. The seeping holes 426 and 427 may facilitate fluid exchange between the fluid chamber 424 and fluid chambers 417, 418 of the outer tube 402. By having relatively small diameters between approximately $\frac{1}{32}$-inch and $\frac{1}{4}$-inch, the seeping holes may prevent dynamic pressure changes inside the inner tube 408 (fluid chamber 424). In some examples, a silicone-based fluid, an oil-based fluid, or other fluidic materials may be used in the fluid chambers. The lead-lag damper may include a filling system such as a rapid vacuum filling system and may allow for quick fluid transfer while under a vacuumed condition. Seeping hole 427 (and corresponding holes along the same diameter) may be offset from the seeping holes 426 in regular operation configuration further restricting fluid flow between fluid chamber 424 and fluid chambers 417, 418. In an initial setup (or maintenance setup) operation of the lead-lag damper, the plunger-spring system may be removed from the inner tube 408, the seeping holes aligned and the fluid chamber 424 may be filled quickly.

The floating annular ring 428 of the lead-lag damper may form an annular orifice around the spacer tube 407 with several diametrical protrusions (tabs) toward an outside surface of the inner tube and create a linear performance. That is, tabs of the annular ring 428 may contact the outside surface of the spacer tube 407 in operation (when the floating annular ring 428 rotates along with the spacer tube 407) and may reduce axial center shaft misalignment. Without the benefit of the floating annular ring, center shaft misalignment may result high variations of performance.

A lead-lag damper according to some examples may include one or more elastomer bearings that may include a rubber compound for strength and may be specifically blended for improved cold temperature performance. An elastomeric configuration and profile of the elastomer bearing 422 may be created to achieve high radial stiffness. The lead-lag damper may also include static seals at locations along outer surfaces of the elastomer bearings and/or the guide structure 436 to allow for easy disassembly and refurbishment of the elastomer bearings.

Figure 4B:
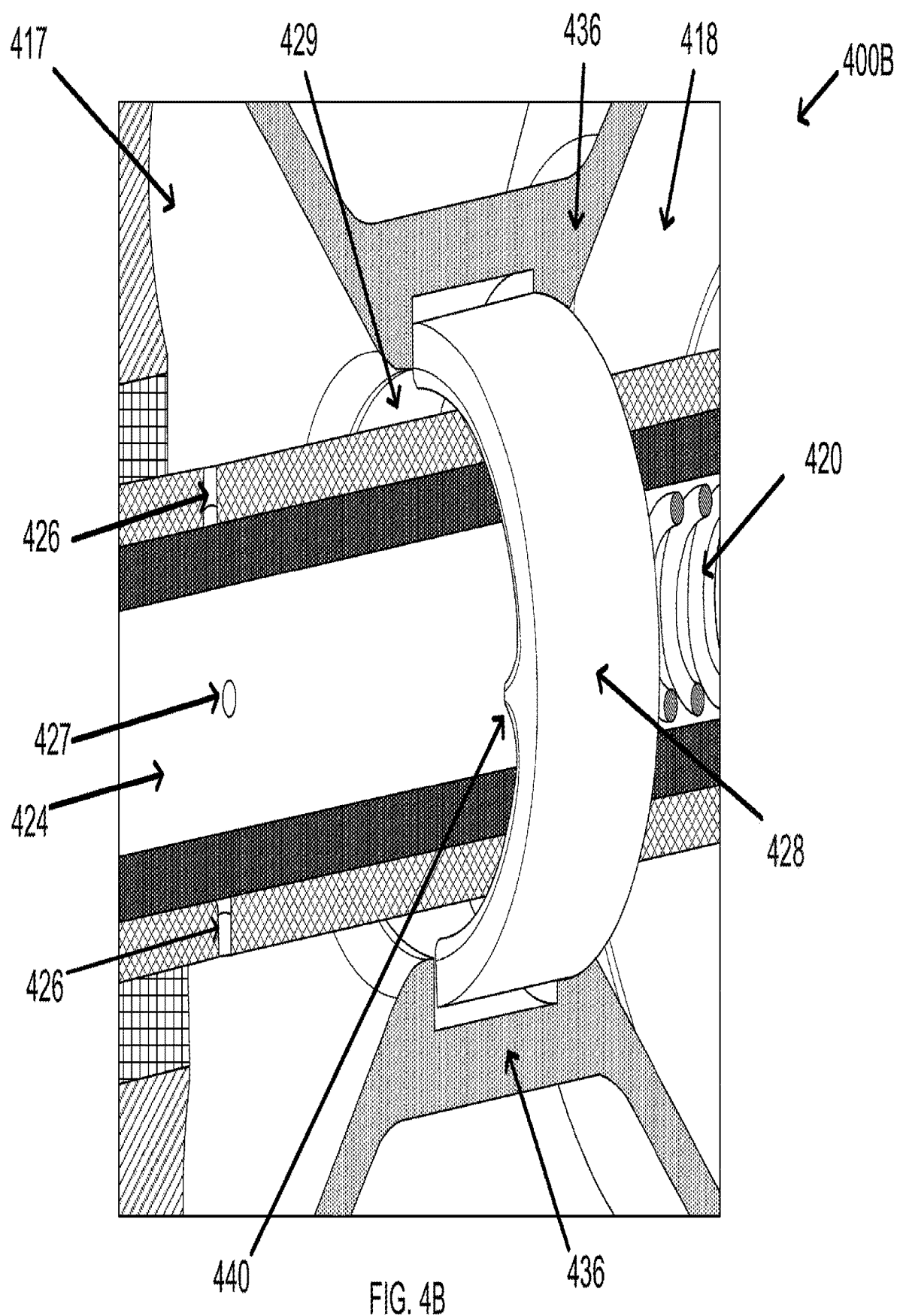
FIG. 4B illustrates a complete view of the floating annular ring of the single-stage floating annular ring lead-lag damper of FIG. 4A.

FIG. 4B illustrates a complete view of the floating annular ring of the single-stage floating annular ring lead-lag damper of FIG. 4A, arranged in accordance with at least some embodiments described herein.

Diagram 400B shows the floating annular ring 428 in full form, guide structure 436, a portion of the inner tube 408, fluid chamber 424, spring 420, outer tube fluid chambers 417, 418, and seeping holes 426 and 427. Fluid exchange gap 429 between the floating annular ring 428 and an outside surface of the spacer tube 407 may facilitate fluid exchange between fluid chambers 417 and 418. Guide structure 436 may limit a movement of the floating annular ring 428. For example, guide structure 436 may allow the floating annular ring 428 to move radially up to approximately +/−¼ inch relative to the spacer tube 407. The protrusions or tabs 440 on an inside surface of the floating annular ring 428 may contact an outside surface of the spacer tube 407 in operation and track axial misalignment of the inner tube. The floating annular ring 428 may rotate (radially) along with the spacer tube 407 in operation.

In some examples, the guide structure 436 may be an elastomer bearing or a metal bearing affixed to the outer tube. The floating annular ring 428 may be made from polymeric materials, rubber, vulcanized rubber, ceramic materials, metals (e.g., aluminum), or metal alloys. The guide structure 436 may also be made from the same or other materials. In some examples, the floating annular ring 428 and the inner tube 408 may be selected from different materials to prevent galvanic corrosion or galling or other types of wear in operation.

The guide structure, together with the floating annular ring, may also act to provide a "partial separation" between fluid chambers. In some operating modes, there may be free communication between fluid chambers on either side of a given guide structure/floating annular ring but in other operating modes the fluid may still be communicated but may be "throttled" by a fluid-restrictive orifice formed between the inside surfaces of the floating annular ring and outside surfaces of the inner tube. In some configurations and/or operating modes, the floating annular ring may act as a "seal" between fluid chambers, where the gap between the floating annular ring and the mating dynamic surface may become so small as to effectively restrict virtually all fluid transfer from one side of the floating annular ring to the other.

Figure 4C:
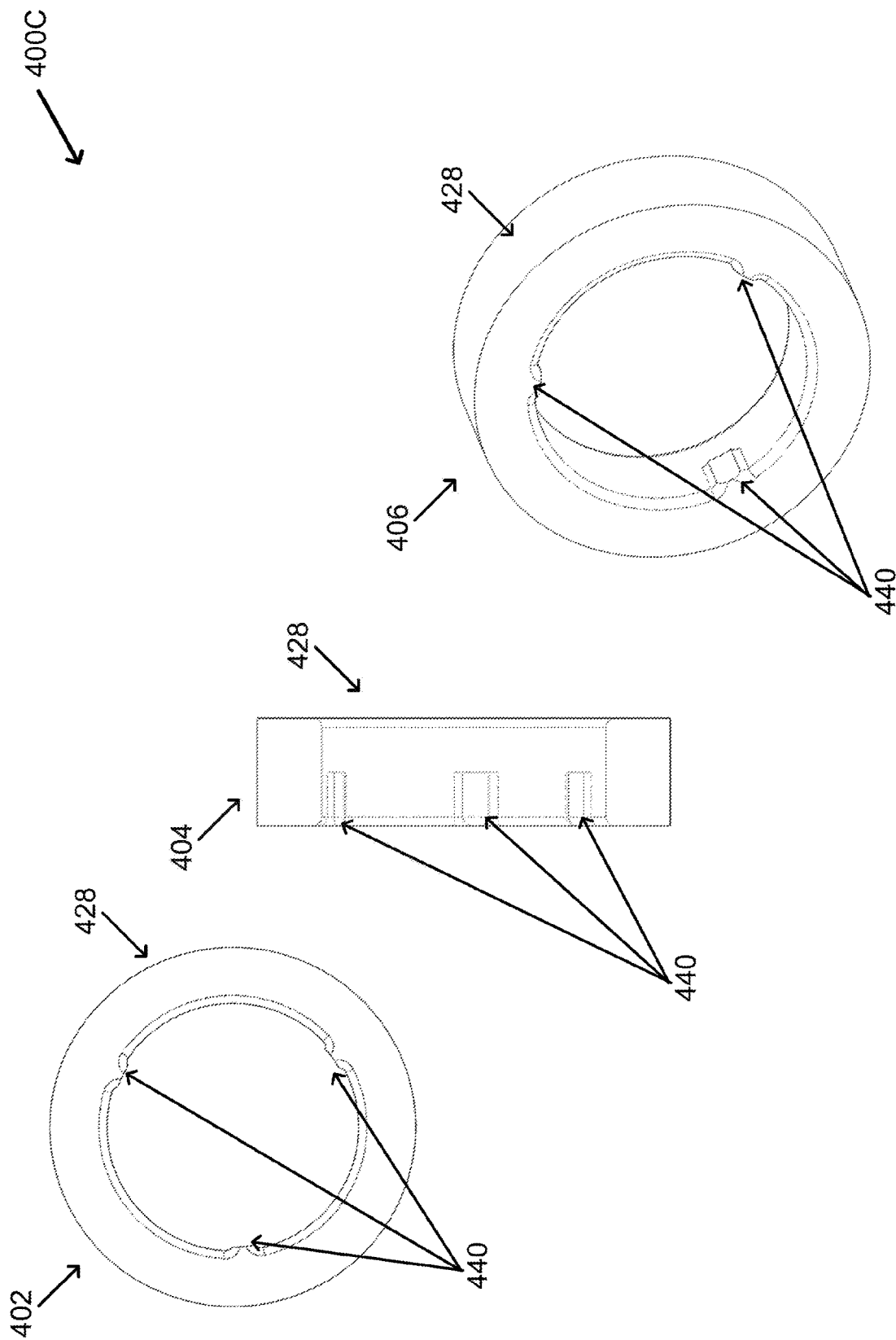
FIG. 4C illustrates three different views an example floating annular ring.

FIG. 4C illustrates three different views an example floating annular ring, arranged in accordance with at least some embodiments described herein.

Diagram 400C includes a top view 402 presenting the floating annular ring with three tabs 440 distributed substantially equidistant along an inner surface of the floating annular ring, cross-sectional side view 404, and perspective view 406 further showing how the tabs 440 protrude from the inner surface of the floating annular ring. As the spacer tube 407 moves radially within the fluid inside the outer tube, the tabs 440 may track the spacer tube 407 movement thereby allowing the floating annular ring to maintain substantially the same orifice area, resulting in stable performance.

Tabs 440 on the inside surface of the floating annular ring(s) help maintain a coaxial alignment of the floating annular ring(s) such that a consistent radial gap in promoted. Ensuring a consistent gap between the floating annular ring(s) and the inner tube may yield more consistent flow between fluid chambers on either side of the floating annular ring(s). In some examples, the inside surface of the floating annular ring may look like a spline (or "reversed") such that there is a relatively small clearance between the inside surface of the floating annular ring(s) and outside surface of the inner tube, and the inside surface of the floating annular ring(s) may include one or more slots or grooves. In other examples, a small clearance gap may be formed between at least one of the floating annular rings and the outside surface of the inner tube, but the inner tube outside surface may instead include a stepped profile (similar to the tab 632 in FIG. 6C) or axially-aligned grooves or flats machined or formed in the outside surface of the inner tube.

Figure 5:
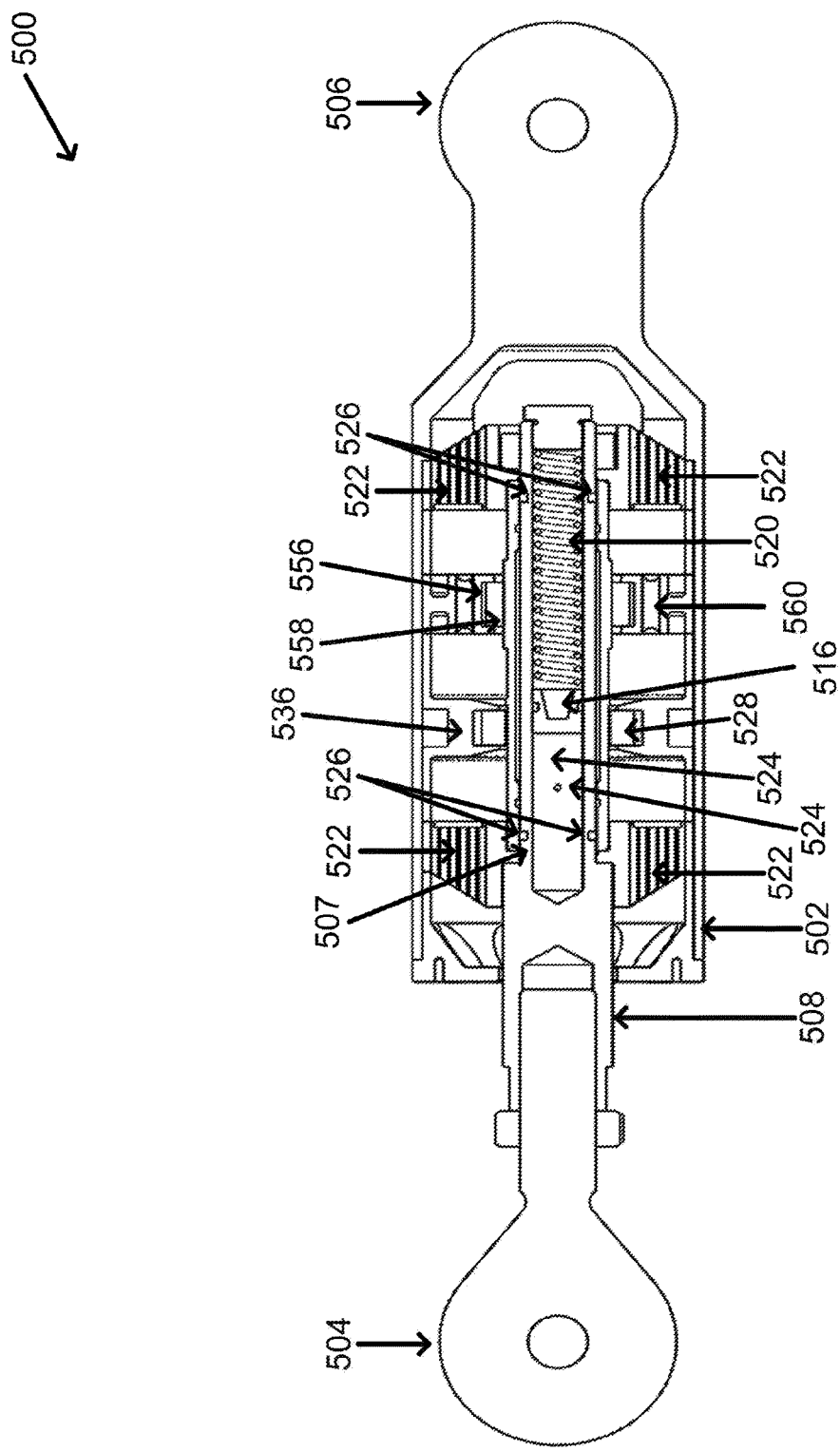
FIG. 5 illustrates a side cross-sectional view of an example two-stage floating annular ring lead-lag damper.

FIG. 5 illustrates a side cross-sectional view of an example two-stage floating annular ring lead-lag damper, arranged in accordance with at least some embodiments described herein.

The two-stage floating annular ring lead-lag damper shown in diagram 500 includes couplers 504, 506, outer tube 502, inner tube 508, spring 520, seeping holes 526 in the spacing tube 507, seeping holes 527 in the inner tube 508, fluid chamber 524 of the inner tube 508, elastomer bearings 522, first stage floating annular ring 528, guide structure 536, second stage floating annular ring 558, guide structure 556, and secondary spring element 560.

As in FIG. 2, inner tube 508 is concentrically positioned inside the outer tube 502 within an annular gap. Elastomer bearings 522 act as dynamic seals defining one or more fluid chambers in the annular gap. Guide structures 536 and 556, as well as, first stage and second stage floating annular rings 528 and 558 are positioned in respective fluid chambers annularly surrounding the spacer tube. The plunger-spring system (plunger 516, spring 520) is configured to manage fluid volume changes. The damping effect is created by the fluid transitioning between the outer fluid chambers and their respective floating annular orifices. Temperature changes inside the lead-lag damper can cause a change in the volume of the fluid, in which case, the fluid is exchanged between the fluid chamber 524 and the outer fluid chambers (through the seeping holes 526, 527) managed by the plunger-spring system. The seeping holes 526 and 527 may facilitate fluid exchange between the fluid chamber 524 and fluid chambers of the outer tube 502.

The first stage floating annular ring 528 supported by the guide structure 536 may contact the spacer tube in operation through tabs (not shown) on its inside surface and provide radial alignment. Similarly, second stage floating annular ring 558 supported by the guide structure 556 may surround the spacer tube at an axially offset location and enhance the performance by tracking the radial movements of the spacer tube and maintaining a stable floating orifice area as with the first floating annular ring 528. The first and second floating annular rings 528 and 558 may also control fluid exchange between respective fluid chambers of the outer tube 502 on either axial side of each floating annular ring.

In some examples, the lead-lag damper may include static O-ring seals and no dynamic seals. Seal locations may be external or internal for disassembly and refurbishment of the elastomer bearings. In other examples, the lead-lag damper may include bonded elastomer bearings acting as dynamic seals. The lead-lag damper may also include a fluid volume compensation system utilizing the seeping holes 526 and 527. The fluid may be a silicone-based fluid, an oil-based fluid, or other fluidic material.

FIG. 6A-6D illustrate various exploded side cross-sectional views of an example two-stage floating annular ring lead-lag damper and a secondary spring element associated with the two-stage floating annular ring lead-lag damper, arranged in accordance with at least some embodiments described herein.

Figure 6A:
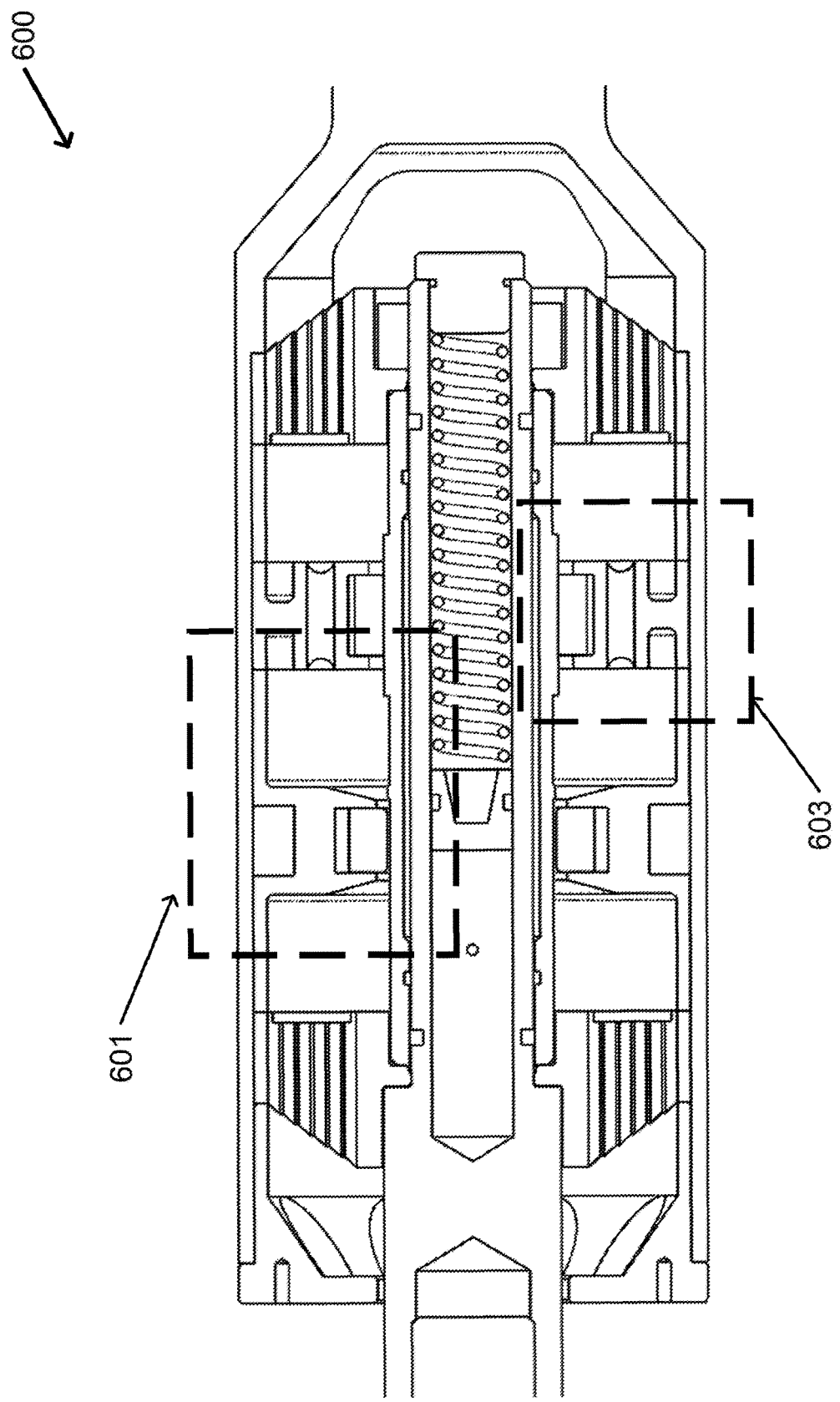
FIG. 6A-6D illustrate various exploded side cross-sectional views of an example two-stage floating annular ring lead-lag damper and a secondary spring element associated with the two-stage floating annular ring lead-lag damper.

Diagram 600 in FIG. 6A shows a close-up view of a cross-section of the outer tube of an example lead-lag damper with a two-stage floating annular ring and secondary spring system. On the diagram, two areas: first stage floating annular ring (601) and second stage floating annular ring with the secondary spring system (603) are indicated. The indicated areas are discussed in more detail below.

Figure 6B:
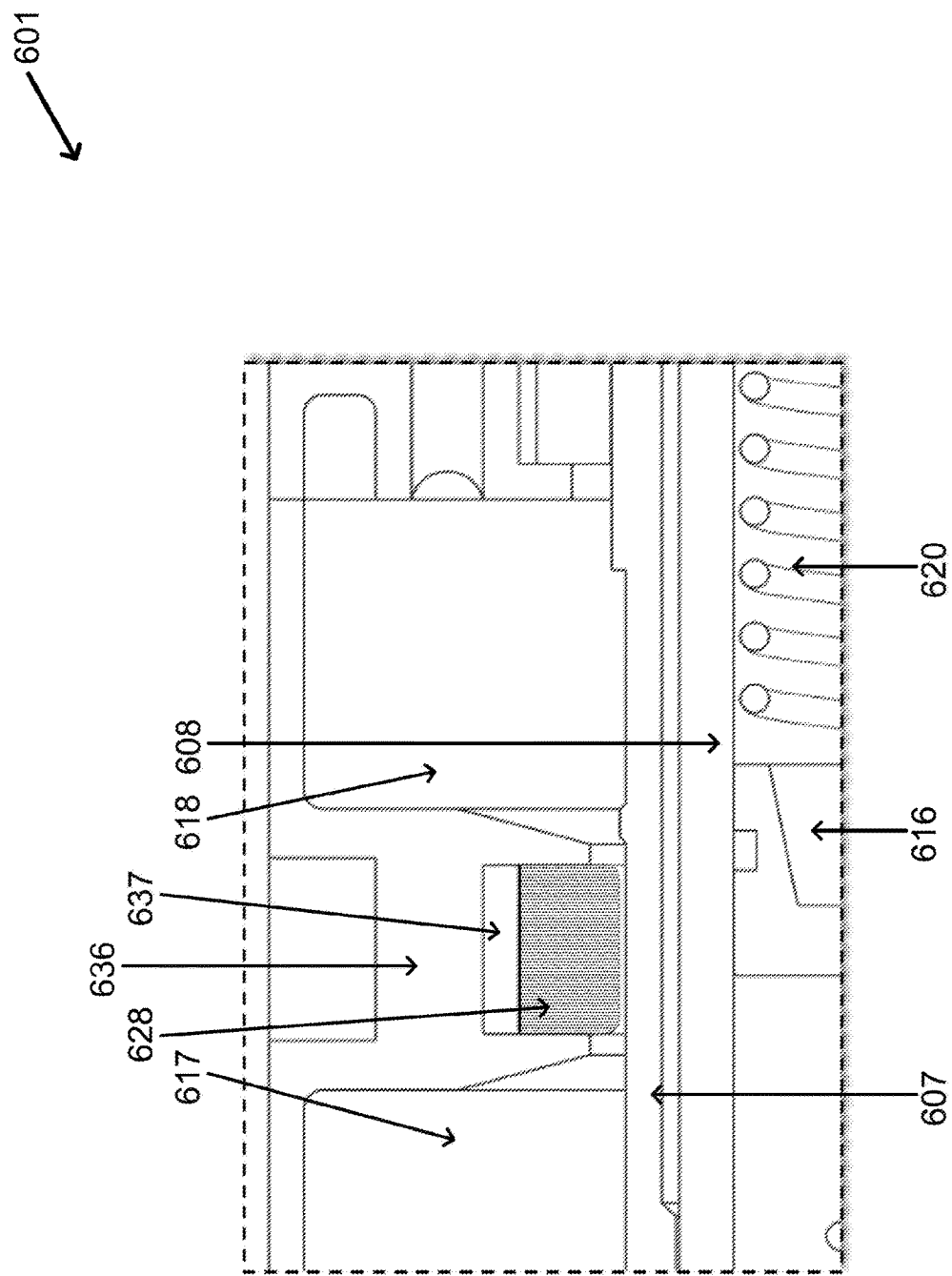

FIG. 6B shows the first stage floating annular ring close-up and includes a portion of the inner tube 608, spacer tube 607, outer tube fluid chambers 617, 618, guide structure 636, and floating annular ring 628. Floating annular ring 628 is movably positioned in a hollow portion 637 of the guide structure 636 capable of moving away from and toward the inner tube 608 during operation within the hollow portion 637. Guide structure 636 may be mechanically attached to or floating inside the outer tube. The radial movements of the floating annular ring 628 may maintain a consistent gap between the ring and the spacer tube facilitating similar fluid exchange between the fluid chamber 617 and the fluid chamber 618. The hollow portion 637 of the guide structure 636 may limit a position of the floating annular ring 628 axially, while allowing small radial movements and not restricting rotational movements. Other portions of the guide structure 636 may be hollowed out (e.g., upper portion) as well to reduce overall mass of the lead-lag damper. Elastomer bearings (not shown) may create dynamic seals within the outer tube and define outer surfaces for one or more fluid chambers (617, 618) in the outer tube, where the spacer tube 607 is positioned. The floating annular ring 628 may compensate for any radial misalignment of the spacer tube 607 by following a radial movement of the spacer tube 607 and contacting its outer surface with protrusions on an inside surface of the annular ring.

Figure 6C:
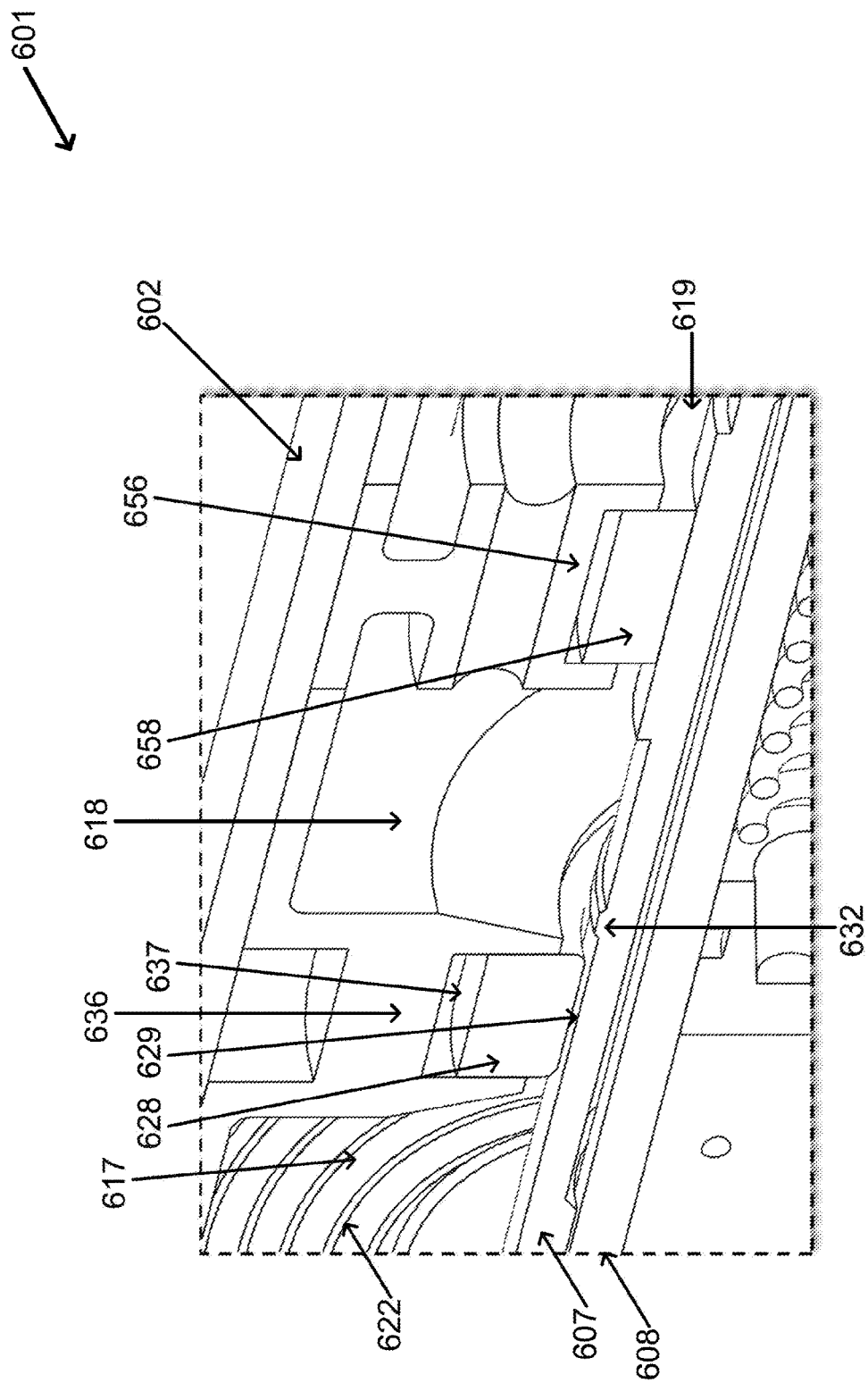

FIG. 6C shows an enlarged version of the indicated area 601 including first stage floating annular ring 628 and corresponding guide structure 636, a second stage floating annular ring 658 and corresponding guide structure 656, inner tube 608, outer tube 602, elastomer bearing 622, spacer tube 607, and tab 632 on an outer surface of the spacer tube 607. The first stage floating annular ring 628 may be positioned between fluid chambers 617 and 618 of the outer tube, while the second stage floating annular ring 658 may be positioned between fluid chambers 618 and 619 of the outer tube. The second stage floating annular ring 658 may be shaped and positioned around the spacer tube 607 similar to the first stage floating annular ring 628 with an axial offset. A guide structure 656 may limit movements of the second stage floating annular ring 658 radially and axially similar to the guide structure 636. The guide structure 636 may allow small radial movements of the first floating annular ring 628 within a hollow portion 637.

When the first floating annular ring 628 moves away from the spacer tube 607, fluid exchange gap 629 will remain consistent allowing similar fluid exchange between fluid chambers 617 and 618. The shapes of the guide structures 636 and 656 illustrate various shapes the guide structures may take. The second floating annular ring 658 may be made from the same material(s) as the first floating annular ring 628 or from different materials. The fluid exchange gap 629 between the first floating annular ring and an outside surface of the spacer tube 607 may be in a range from approximately 0.01 inches to approximately 0.125 inches.

In some examples, tab 632 on the outer surface of the spacer tube 607 may be configured to further restrict or unrestrict fluid flow in conjunction with the fluid exchange gap 629. The tab 632 may become engaged (pushed into the floating annular ring) after a certain axial tension displacement. At this extension state, the tab (or larger shaft diameter) enter the flexible orifice ring and change the area the fluid must flow through. Thus, the performance of the damper is changed during this tension extension displacement zone. As shown in FIG. 4C, the tabs 440 of the floating annular ring do not extend across a width of the ring. Thus, inside the floating annular ring, there is space to allow the tab 632 (which is of a different annular portion of the spacer tube) to fit inside the floating annular ring.

Figure 6D:
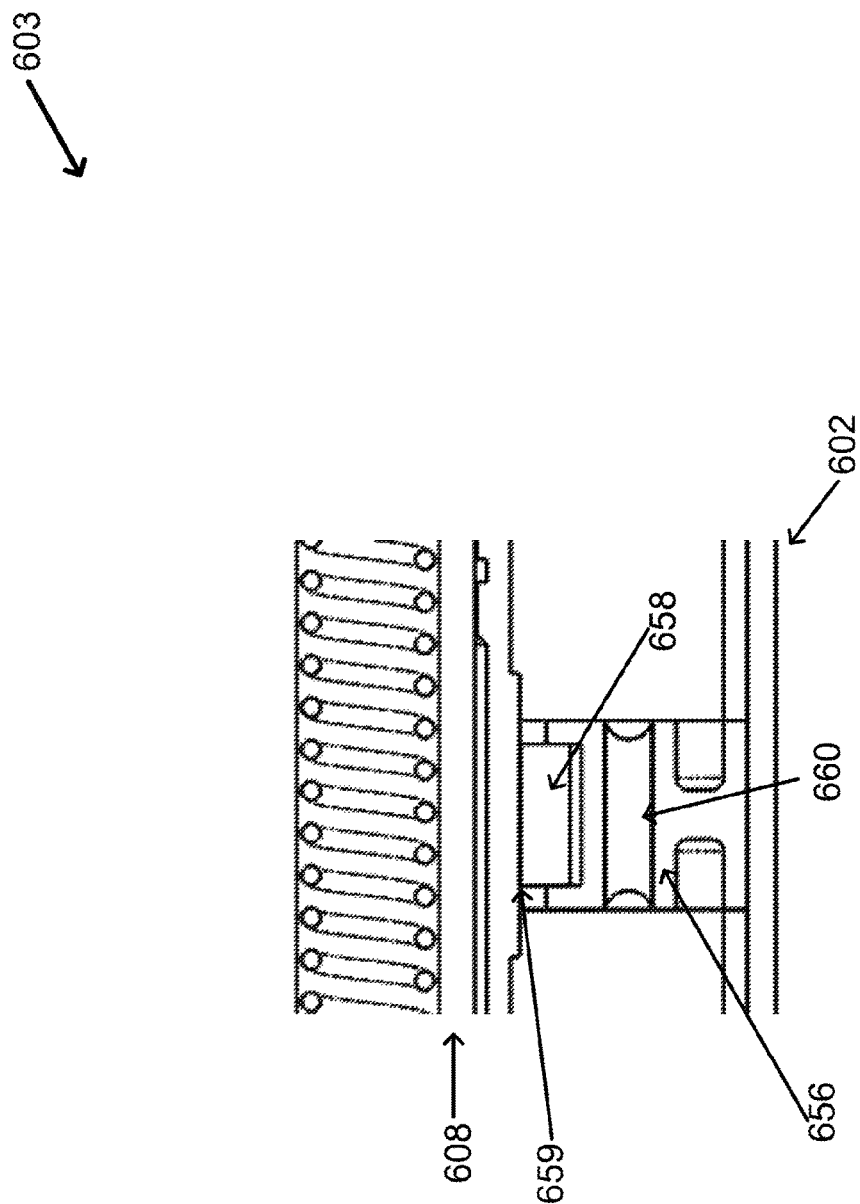

FIG. 6D shows an example second floating annular ring implementation as a secondary spring system and includes portions of outer tube 602, inner tube 608, as well as, second floating annular ring 658, guide structure 656, and fluid exchange gap 659. In the illustrated configuration, the fluid exchange gap 659 is smaller than the first floating orifice (e.g., 0.001 to 0.005 inches). The second floating annular ring 658 is supported by the guide structure 656, which may include an elastomeric bearing that is a second internal elastomer spring element 660. The second internal elastomer spring element 660 may be attached to a floating bearing to allow for any misalignment and eliminate the need for heavy metallic guide bearings.

The second internal elastomer spring element may have a close fit tolerance, which may allow for fluid to communicate between chambers when loads are applied slowly (statically). Static loads may not flex the elastomeric bearing of the second internal elastomer spring element. When dynamic loads are applied to the center rod, a floating metallic bearing and the elastomeric bearing of the system may become hydraulically coupled and may create a 'fluid-lock' condition. When the system becomes hydraulically coupled, the elastomeric bearing of the second internal elastomer spring element may be driven by the fluid and may add a storage stiffness (K') value to the dynamic conditions. When the dynamic loads are removed, the elastomeric bearing of the second internal elastomer spring element may re-center its position to a no-load state. In some examples, the lead-lag damper may have a dynamic storage stiffness of K' at 7,000 lb/in while maintaining a low static stiffness.

Figure 7A:
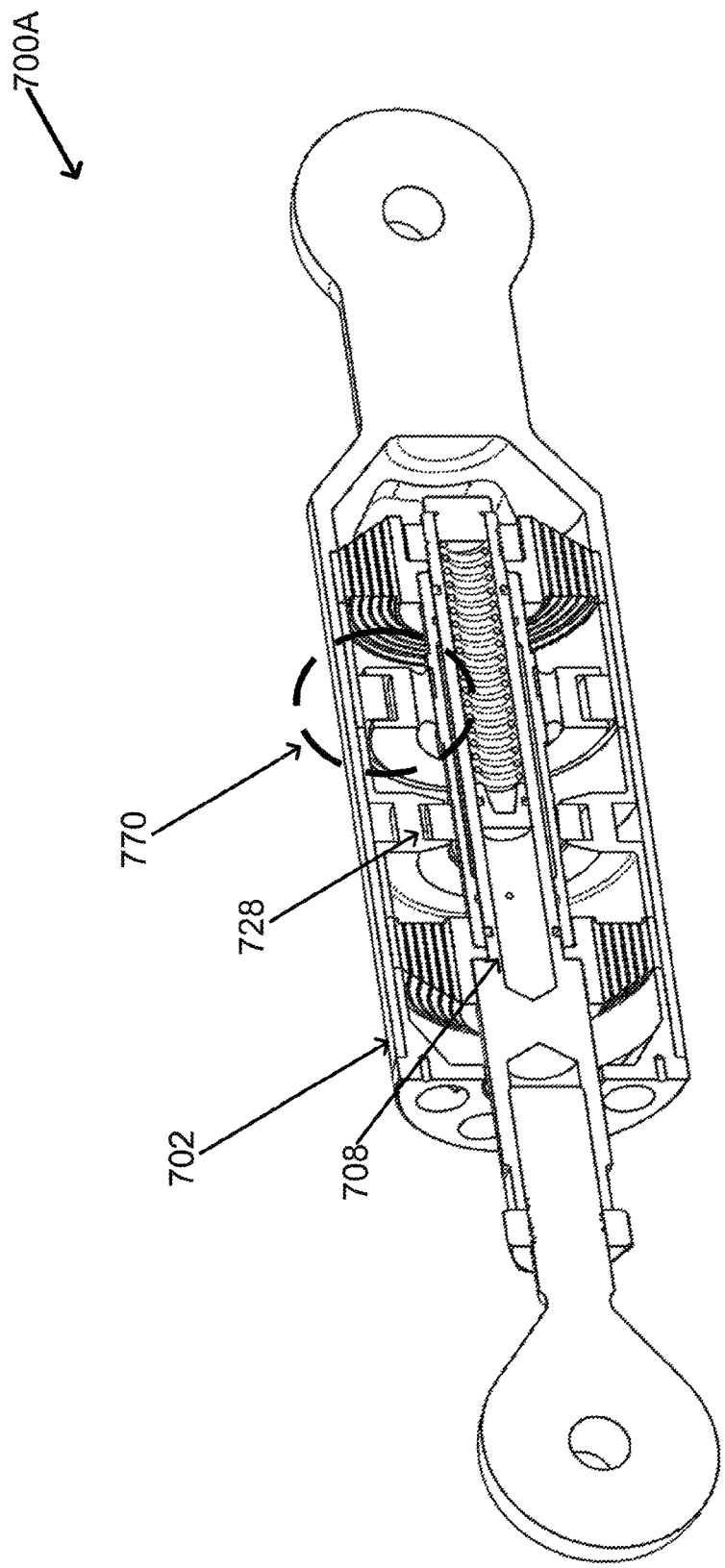
FIG. 7A illustrates a side cross-sectional perspective view of an example two-stage floating annular ring lead-lag damper with a reversed floating annular ring configuration.

FIG. 7A illustrates a side cross-sectional perspective view of an example two-stage floating annular ring lead-lag damper with a reversed floating annular ring configuration, arranged in accordance with at least some embodiments described herein.

Diagram 700A shows a two-stage floating annular ring lead-lag damper similar to the one discussed in conjunction with FIG. 5 above with outer tube 702, inner tube 708, first stage floating annular ring 728, and second stage floating orifice assembly 770. Differently from the example lead-lag damper of FIG. 5, the damper in diagram 700A includes a reverse configuration second floating orifice assembly 770 in addition to the first floating annular ring 728 within the outer tube 702.

Figure 7B:
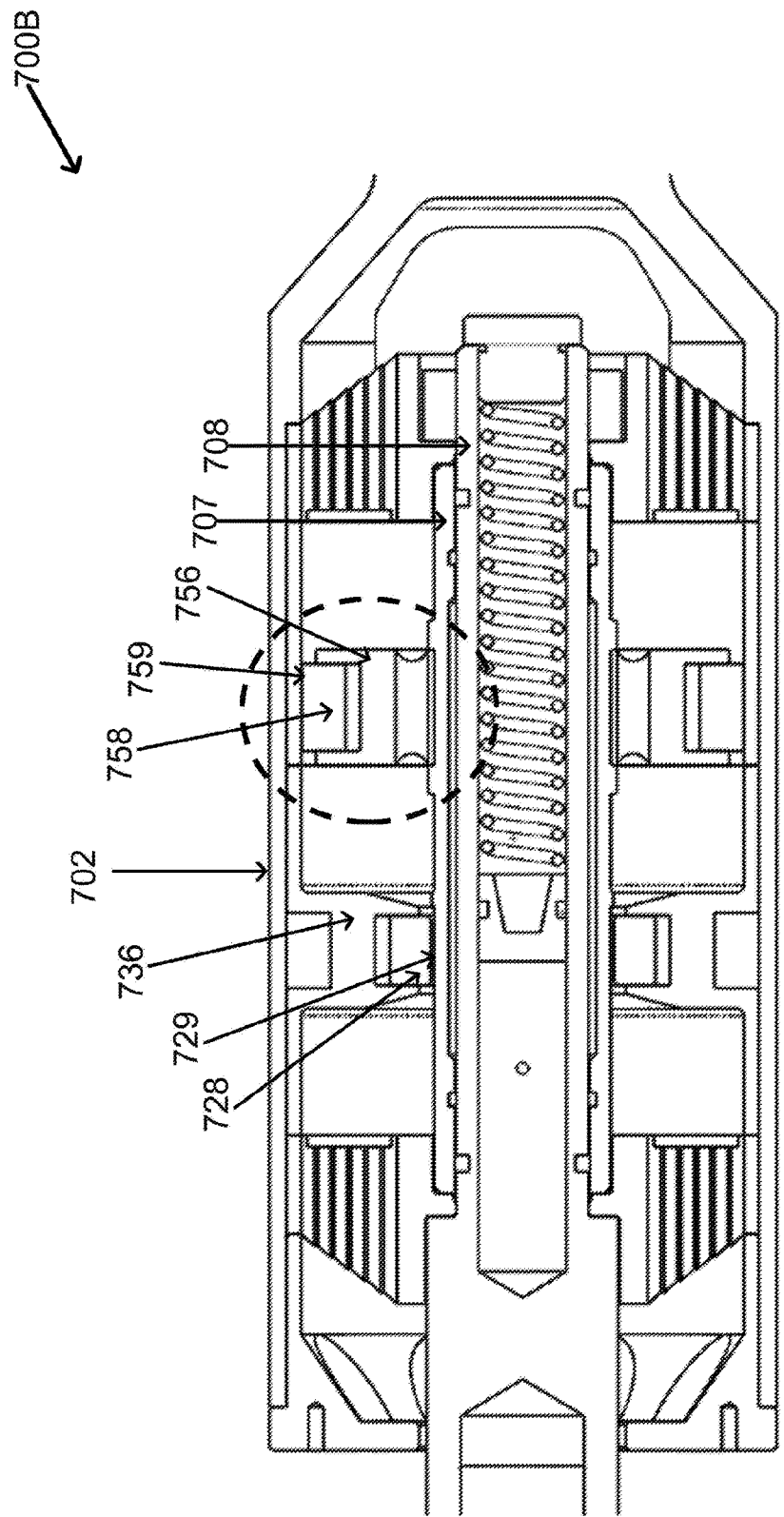
FIG. 7B illustrates an exploded side cross-sectional view of the example two-stage floating annular ring lead-lag damper with a reversed floating annular ring configuration, all arranged in accordance with at least some embodiments described herein.

FIG. 7B illustrates an exploded side cross-sectional view of the example two-stage floating annular ring lead-lag damper with a reversed floating annular ring configuration, arranged in accordance with at least some embodiments described herein.

Diagram 700B shows outer tube 702 of an example lead-lag damper with inner tube 708, first stage floating annular ring 728 and its supporting guide structure 736 with a fluid exchange gap 729 between the first stage floating annular ring 728 and the spacer tube 707. The diagram also includes reverse configuration second stage floating annular ring 758 and its supporting guide structure 756 with a second fluid exchange gap 759 between the second stage floating annular ring 758 and the outer tube 702. The reverse configuration may include the guide structure 756 concentrically positioned around the spacer tube 707, and the second floating annular ring 758 positioned concentrically around the guide structure 756 inside the outer tube 702. Thus, radially, the guide structure 756 is sandwiched between the second floating annular ring 758 and the spacer tube 707. In the reverse configuration, one or both of the guide structure 756 and the second floating annular ring 758 may be floating with respect to the outer tube 702 and/or the spacer tube 707 according to some examples.

The elastomer bearings may be configured for a total axial spring stiffness in a range from about 500 lb/in to about 5,000 lb/in. In some examples, elastomeric strains may be balanced by contouring of the elastomer layer length allowing the same modulus of elastomer to be used. The lead-lag damper may operate in a temperature range of about −40° F. to about 160° F. in some examples. In other examples, a thermally conductive paint system may be applied to the outer surface of the outer tube of the damper to assist in heat dissipation instead of commonly used paints which may be thermally insulating.

The benefits of the presently disclosed lead-lag dampers are numerous. In addition to the benefits discussed above, a lead-lag damper according to examples may track spacer tube misalignment without a need for heavy metallic alignment bushings, for example. The lead-lag damper may manage heat dissipation assuming limited airflow circulation. The lead-lag damper according to examples may also avoid a need for a gas charge system used for the fluid volume compensation. The lead-lag damper may include mechanical stops in the compression and tension directions while allowing internal components unrestricted motion within this range. By contouring elastomer bearings, overall weight reduction may be achieved. An example lead-lag damper may have a weight below 25 lbs.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled. The terminology used herein is for the purpose of describing particular embodiments only and is not intended to be limiting.

The herein described subject matter sometimes illustrates different components contained within, or connected with, different other components. Such depicted architectures are merely examples, and in fact, many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

For any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A lead-lag damper comprising:
  an outer tube mechanically coupled to a first coupler;
  one or more substantially annular elastomer bearings inside the outer tube;
  a spacer tube concentrically and movably positioned inside the outer tube and partially surrounded by the one or more elastomeric bearings;
  an inner tube mechanically coupled to a second coupler and concentrically positioned inside the spacer tube, wherein sidewalls of the inner tube define a first fluid chamber inside the inner tube; and
  a floating annular ring positioned in concentric alignment about a portion of the outer tube, wherein
    the one or more elastomer bearings and the floating annular ring define at least a second fluid chamber and a third fluid chamber inside the outer tube,
    the second and third fluid chambers are configured in fluidic communication with one another and with the first fluid chamber,
    the floating annular ring includes an inside surface with two or more protrusions,
    the two or more protrusions each extend at least partially across a width of the inside surface of the floating annular ring and are configured to occasionally reposition the floating annular ring to maintain a coaxial relationship to the spacer tube, and
    the floating annular ring is configured to:
      substantially surround the spacer tube,
      track radially with a spacer tube misalignment, and
      control the fluidic communication between the second fluid chamber and the third fluid chamber.

2. The lead-lag damper of claim 1, wherein the floating annular ring is made from one or more of a polymeric material, rubber, vulcanized rubber, a ceramic material, a metal, or a metal alloy.

3. The lead-lag damper of claim 1, further comprising:
  a guide structure inside the outer tube, the guide structure configured to limit movement of the floating annular ring to a predefined axial position and allow the floating annular ring to translate radially along with the spacer tube in operation.

4. The lead-lag damper of claim 3, wherein the guide structure is configured to allow the floating annular ring to move radially within a limited range effective to control a consistent fluid exchange gap between the second fluid chamber and the third fluid chamber of the outer tube.

5. The lead-lag damper of claim 3, wherein the guide structure is configured to move within a limited range inside the outer tube or is mechanically coupled to one of the spacer tube and the outer tube.

6. The lead-lag damper of claim 1, further comprising:
  a plunger-spring system inside the inner tube to provide volume compensation fluid exchange between one or both of the second and third fluid chambers and the first fluid chamber.

7. The lead-lag damper of claim 1, further comprising:
  one or more seeping holes in a sidewall of the inner tube, the seeping holes configured to provide fluidic communication between the first fluid chamber and one or both of the second and third fluid chambers without causing a dynamic pressure change in the first fluid chamber.

8. A lead-lag damper comprising:
  an outer tube mechanically coupled to a first coupler;
  one or more substantially annular elastomer bearings inside the outer tube;
  a spacer tube concentrically and movably positioned inside the outer tube and partially surrounded by the one or more elastomeric bearings;
  an inner tube mechanically coupled to a second coupler and concentrically positioned inside the spacer tube, wherein sidewalls of the inner tube define a first fluid chamber inside the inner tube;
  a first floating annular ring positioned in concentric alignment about a first portion of the outer tube; and
  a second floating annular ring positioned in concentric alignment about a second portion of the outer tube offset from the first portion, wherein
    the one or more elastomer bearings, the first floating annular ring, and the second floating annular ring at least partially define one or more of a second fluid chamber, a third fluid chamber, and a fourth fluid chamber inside the outer tube,
    the second, third, and fourth fluid chambers are configured in fluidic communication with one another and with the first fluid chamber, and
    the first floating annular ring and the second floating annular ring are configured to:
      substantially surround the spacer tube, and
      control a consistent fluid exchange gap, respectively, between the second and third fluid chambers and the third and fourth fluid chambers of the outer tube.

9. The lead-lag damper of claim 8, wherein
at least one of the first floating annular ring and the second floating annular ring includes an inside surface with two or more protrusions,
the two or more protrusions each extend at least partially across a width of the inside surface,
the two or more protrusions are substantially equidistantly distributed along the inside surface, and
the two or more protrusions are configured to occasionally reposition the first floating annular ring or the second floating annular ring to maintain a coaxial relationship to the spacer tube.

10. The lead-lag damper of claim 8, wherein the first floating annular ring and the second floating annular ring are made from a material that is dissimilar to a material of the spacer tube to prevent galvanic corrosion or galling in operation.

11. The lead-lag damper of claim 8, further comprising:
a first guide structure and a second guide structure inside the outer tube, the first guide structure and the second guide structure configured to limit movement of the first floating annular ring and the second floating annular ring, respectively, to a predefined axial position and allow the first floating annular ring and the second floating annular ring to move or rotate radially along with the spacer tube in operation.

12. The lead-lag damper of claim 8, further comprising:
a plunger-spring system inside the inner tube to provide volume compensation fluid exchange between the first fluid chamber and one or more of the second, third, and fourth fluid chambers.

13. A lead-lag damper comprising:
an outer tube mechanically coupled to a first coupler;
one or more substantially annular elastomer bearings inside the outer tube;
a spacer tube concentrically and movably positioned inside the outer tube and partially surrounded by the one or more elastomeric bearings;
an inner tube mechanically coupled to a second coupler and concentrically positioned inside the spacer tube, wherein sidewalls of the inner tube define a first fluid chamber inside the inner tube;
a first floating annular ring positioned in concentric alignment about a first location inside the outer tube, wherein the first floating annular ring is configured to substantially surround the spacer tube;
a first guide structure about the first location inside the outer tube, the first guide structure configured to limit movement of the first floating annular ring to a predefined axial position and allow the first floating annular ring to move and rotate radially along with the spacer tube;
a second floating annular ring positioned in concentric alignment about a second location inside the outer tube offset from the first location; and
a second guide structure about the second location inside the outer tube, the second guide structure configured to substantially surround the spacer tube, limit movement of the second floating annular ring to a predefined axial position, and allow the second floating annular ring to move and rotate radially.

14. The lead-lag damper of claim 13, wherein
the one or more elastomer bearings, the first guide structure, and the first floating annular ring define at least partially a second fluid chamber and a third fluid chamber, and
the first floating annular ring is configured to control a consistent fluid exchange between the second and third fluid chambers through a fluid exchange gap between an inside surface of the first annular ring and an outside surface of the spacer tube.

15. The lead-lag damper of claim 14, further comprising:
a raised or recessed annular tab on an outside surface of the spacer tube, the raised or recessed annular tab configured to:
enter a fluid exchange gap defined by the first floating annular ring in a tension state or a compression state; and
further control the fluid exchange between the second fluid chamber and the third fluid chamber through the fluid exchange gap.

16. The lead-lag damper of claim 13, wherein
the one or more elastomer bearings, the second guide structure, and the second floating annular ring define at least partially the third fluid chamber and a fourth fluid chamber, and
the second floating annular ring is configured to control a consistent fluid exchange between the third and fourth fluid chambers through a fluid exchange gap between an outside surface of the second annular ring and an inside surface of the outer tube.

17. A method to manufacture a lead-lag damper, the method comprising:
mechanically coupling an outer tube to a first coupler;
fitting one or more substantially annular elastomer bearings inside the outer tube;
fitting a spacer tube concentrically and movably inside the outer tube, wherein the spacer tube is partially surrounded by the one or more elastomeric bearings;
mechanically coupling an inner tube to a second coupler, wherein sidewalls of the inner tube define a first fluid chamber inside the inner tube;
fitting a plunger-spring system inside the inner tube to provide volume compensation fluid exchange between the first fluid chamber and two or more fluid chambers of the outer tube;
forming one or more seeping holes in the sidewalls of the inner tube and the spacer tube to facilitate fluidic exchange between the first chamber and the two or more fluid chambers of the outer tube;
fitting a floating annular ring in concentric alignment about a portion of the outer tube such that the floating annular ring substantially surrounds the spacer tube and is radially movable to control a consistent fluid exchange between the one or more fluid chambers of the outer tube; and
partially fitting the inner tube inside the spacer tube.

18. The method of claim 17, further comprising:
forming a guide structure inside the outer tube to limit movement of the floating annular ring to a predefined axial position and to allow the floating annular ring to move radially within a limited range effective to control a consistent fluid exchange gap between the one or more fluid chambers of the outer tube.

19. The method of claim 17, further comprising:
forming the floating annular ring by disposing two or more protrusions on an inside surface of the floating annular ring such that the two or more protrusions occasionally reposition the annular ring to maintain a coaxial relationship to the spacer tube.

* * * * *